United States Patent [19]

Kim

[11] Patent Number: 5,565,372
[45] Date of Patent: Oct. 15, 1996

[54] METHOD OF MANUFACTURING A SELF-ALIGNED BIT LINE CONTACT TO A SEMICONDUCTOR DEVICE

[75] Inventor: Jae K. Kim, Kyungki-Do, Rep. of Korea

[73] Assignee: Hyundai Electronics Industries Co., Ltd., Kyungki-Do, Rep. of Korea

[21] Appl. No.: 364,048

[22] Filed: Dec. 27, 1994

[30]  Foreign Application Priority Data

Dec. 27, 1993 [KR] Rep. of Korea ............... 1993 29807

[51] Int. Cl.$^6$ ........................................ H01L 21/70
[52] U.S. Cl. ................. 437/52; 437/60; 437/195; 437/919
[58] Field of Search ................. 437/52, 60, 195, 437/919

[56]  References Cited

U.S. PATENT DOCUMENTS

| | | | |
|---|---|---|---|
| 5,114,873 | 5/1992 | Kim et al. | 437/52 |
| 5,140,389 | 8/1992 | Kimura et al. | 357/23.6 |
| 5,206,183 | 4/1993 | Dennison | 437/52 |
| 5,229,326 | 7/1993 | Dennison et al. | 437/195 |
| 5,270,238 | 12/1993 | Kim | 437/52 |
| 5,352,621 | 10/1994 | Kim . | |
| 5,362,666 | 11/1994 | Dennison | 437/52 |

*Primary Examiner*—Tom Thomas
*Assistant Examiner*—Lynne A. Gurley
*Attorney, Agent, or Firm*—Fish & Richardson P.C.

[57]  ABSTRACT

A method of manufacturing a semiconductor device. A conductive layer for the prevention of the capacitor coupling phenomenon is formed between a gate electrode and a bit line. A desired voltage is applied to the conductive layer. The capacitor coupling phenomenon between the bit line and the word line is eliminated as a result. Also, the contact size is reduced by forming a bit line contact with a self alignment method using the conductive layer and by forming a charge storage electrode contact with a self alignment method using the bit line and the conductive layer.

27 Claims, 3 Drawing Sheets

5,565,372

METHOD OF MANUFACTURING A SELF-ALIGNED BIT LINE CONTACT TO A SEMICONDUCTOR DEVICE

FIELD OF THE INVENTION

This invention relates to a method of manufacturing a semiconductor device, and more particularly to a method of manufacturing a semiconductor device that can eliminate the capacitor coupling phenomenon between a bit line and a word line by forming a conductive layer between the bit line and the word line into which a desired voltage is applied.

INFORMATION DISCLOSURE STATEMENT

Generally, a bit line shielded capacitor cell structure in which a bit line is formed prior to the formation of a capacitor is widely known. In the bit line shielded capacitor cell structure, a plate electrode is placed between a bit line and a metal line where a word line is strapped, with the plate electrode maintaining a constant potential level while the bit line voltage and the word line voltage are changed, thereby reducing the capacitor coupling phenomenon between the bit line and the word line. However, such a bit line shielded capacitor cell structure can not eliminate completely the capacitor coupling phenomenon.

Also, in manufacturing a semiconductor device, contact holes are first formed on the substrate in order to form a bit line that is connected to a drain region, or to a charge storage electrode that is connected to a source region. The contact holes must be formed such that the gate electrode is not exposed. Therefore, a gate electrode mask and a contact mask must be designed according to a desired design rule. That is, the masks must be designed considering the critical dimension variation that is generated during the manufacturing of the masks and during the lithography process on a wafer, the misalignment tolerance that is generated during the mask alignment process, and the thickness of the insulating layer that is formed on the side wall of the gate electrode. Consequently, there are limits to decreasing the contact size.

SUMMARY OF THE INVENTION

Therefore, it is the object of the present invention to provide a method of manufacturing a semiconductor device that can eliminate the capacitor coupling phenomenon between a bit line and a word line by forming a conductive layer between the bit line and the word line to which a desired voltage is applied.

Another object of the present invention is to provide a method of manufacturing a semiconductor device that can decrease the contact size by forming a bit line contact by means of a self alignment method using the conductive layer and by forming a charge storage electrode contact through a self alignment method using the bit line and the conductive layer.

To achieve the above objects, a method of manufacturing a semiconductor device according to the present invention, comprising the steps of:

forming a plurality of gate electrodes on a silicon substrate on which an isolation layer is formed, thereafter forming a first insulating layer on said gate electrodes respectively; forming a drain region and a source region on the substrate using openings between the gate electrodes; sequentially forming a second insulating layer and conductive layer on the first insulating layer including the drain region and the source region; forming a third insulating layer on the conductive layer, and forming a first photoresist pattern on the third insulating layer so that a portion of the third insulating layer corresponding to the drain region is exposed; etching an exposed portion of the third insulating layer; sequentially etching the conductive layer and the second insulating layer, exposed by etching the third insulating layer, to expose the drain region, thereby forming a first contact hole for a bit line; removing the first photoresist pattern, and forming a first insulating spacer on the inner walls of the first contact hole; forming a bit line connected to the drain region by filling the first contact hole with a conductive material, with the bit line forming on the third insulating layer; etching a portion of the bit line so that a portion of the third insulating layer corresponding to the source region is exposed; forming a fourth insulating layer on the bit line including an exposed portion of the third insulating layer, and forming a second photoresist pattern on the fourth insulating layer so that a portion of the fourth insulating layer corresponding to the source region is exposed; sequentially etching the fourth and third insulating layers, exposed by the photoresist pattern; sequentially etching the conductive layer, the bit line and the second insulating layer, exposed by the fourth and third insulating layers, to expose the source region, thereby forming a second contact hole for a charge storage electrode; removing the second photoresist pattern, and forming a second insulating spacer on the inner walls of the second contact hole; and forming a bit line connected to the source region by filling the second contact hole.

BRIEF DESCRIPTION OF THE DRAWINGS

For a fuller understanding of the nature and the objective of the invention, reference should be made to the following detailed description in conjunction with the accompanying drawings in which.

Similar references characters refer to similar parts through the several view of the drawings.

DETAILED DESCRIPTION OF THE INVENTION

Figure 1A:
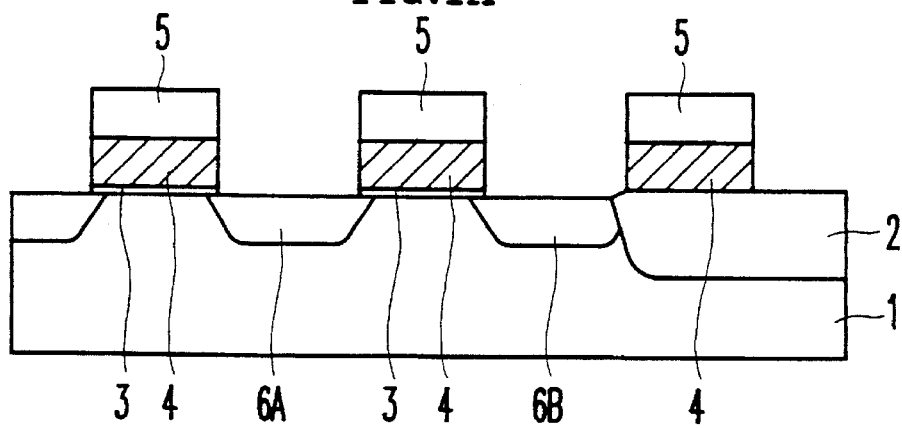
FIG. 1A through FIG. 1G are cross-sectional views showing the manufacturing processes of a semiconductor device according to the present invention.

Referring to FIG. 1A, a plurality of oxide layers 3 are formed on a silicon substrate on which an isolation layer 2 is formed, with the oxide layers 3 isolated from each other. A plurality of gate electrodes 4 are formed on each oxide layers 3, respectively. A plurality of first insulating layers 5 are formed on each gate electrodes 4, respectively. A drain region 6A and a source region 6B are formed on exposed portions of the silicon substrate 1, respectively.

Figure 1B:
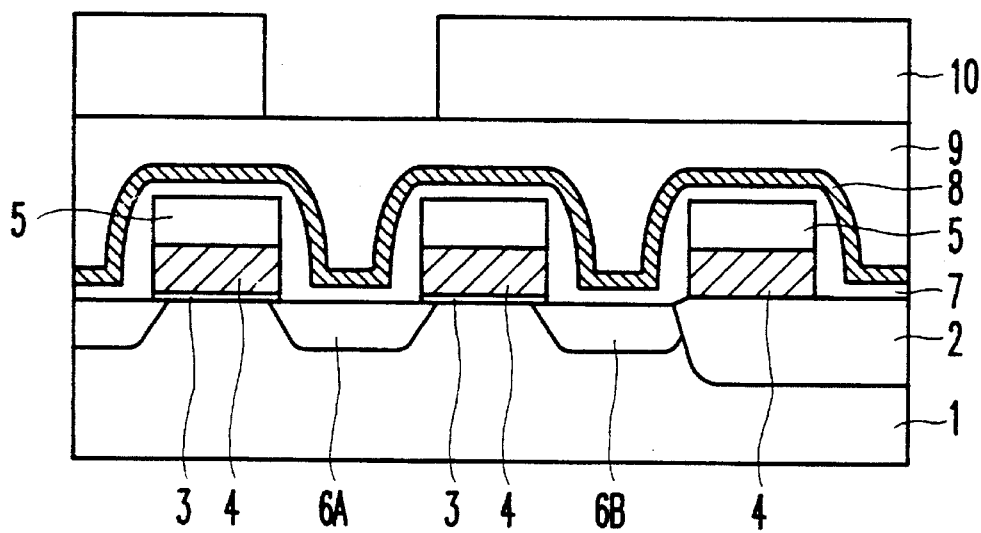

Referring to FIG. 1B, a second insulating layer 7 is formed on the entire surface of the resulting structure including the first insulating layers 5, the drain region 6A and the source region 6B and a conductive layer 8 for the prevention of the capacitor coupling phenomenon is then formed on the second insulating layer 7. A third insulating layer 9 is formed on the conductive layer 8 and then planarized. A first photoresist pattern 10 is formed on the third insulating layer 9 by a lithography method using a bit line contact mask so that a portion of the third insulating layer 9 corresponding to the drain region 6A is exposed.

The conductive layer 8 is preferably formed with polysilicon or amorphous silicon. The third insulating layer 9 is preferably formed with boron phosphorous silicate glass (BPSG), thereafter planarizing the third insulating layer 9 through a flow process. Also, it of no consequence that an opening of the first photoresist pattern 10 is extended to the gate electrode 4 adjacent to the drain region 6A.

Figure 1C:
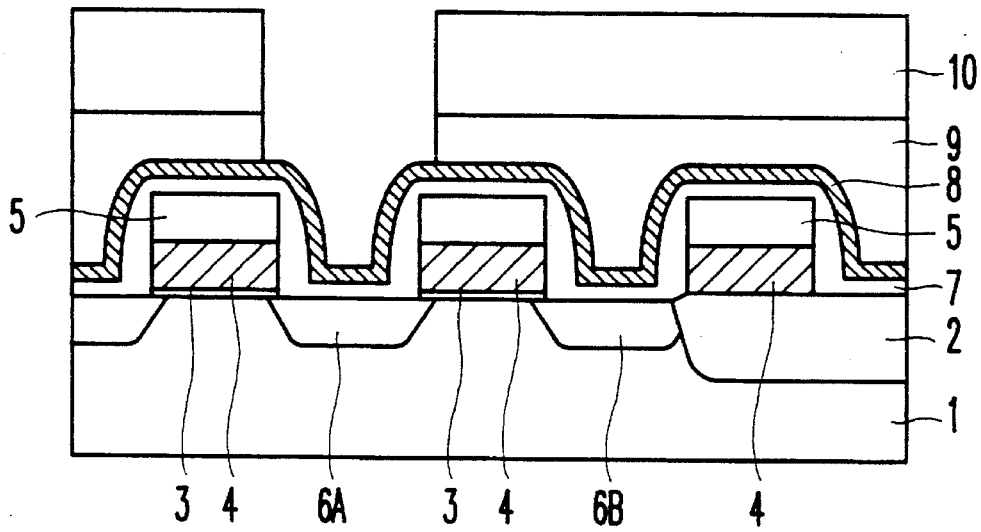

Referring to FIG. 1C, an exposed portion of the third insulating layer 9 is etched by an anisotropic etching method using the first photoresist pattern 10 as a mask. At this stage, the conductive layer 8 acts as an etching barrier.

Figure 1D:
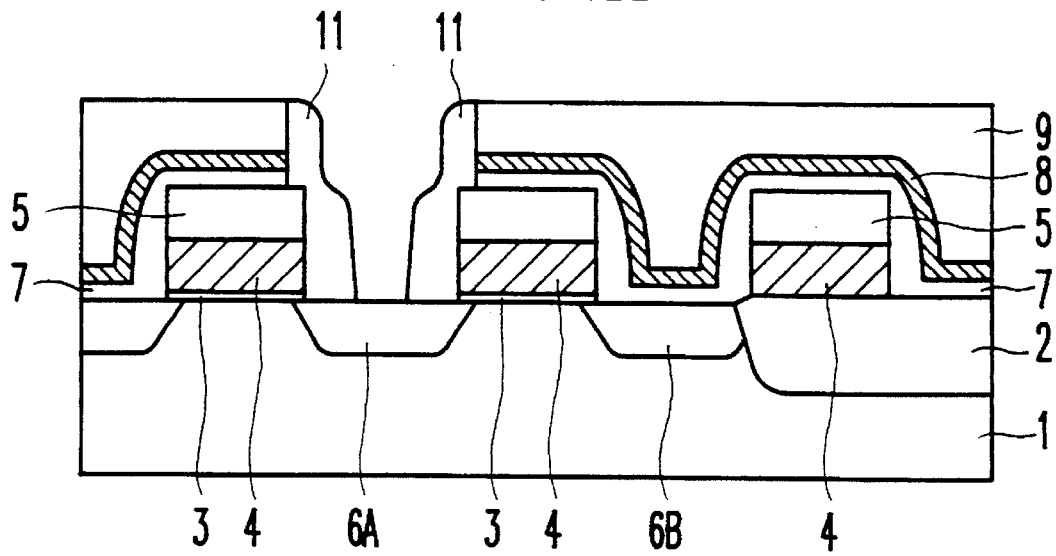

Referring to FIG. 1D, an exposed portion of the conductive layer 8 is etched by an anisotropic etching method using the first photoresist pattern 10 as a mask, and an exposed portion of the second insulating layer 7 is then etched by an anisotropic etching method to expose the drain region 6A, thereby forming a first contact hole for a bit line. The first photoresist pattern 10 is removed and a first insulating spacer 11 is formed on the inner walls of the first contact hole. During this process of etching an exposed portion of the conductive layer 8, the second insulating layer 7 acts as an etching barrier.

The first insulating spacer 11 to insulate the conductive layer 8 and the bit line which will be formed by subsequent processes may be formed by oxidizing an exposed surface of the conductive layer 8. The exposed portion of the conductive layer 8 may be etched by an isotropic etching method using. At this time, an etched surface of the conductive layer 8 is formed inside an etched surface of the second and third insulating layers 7 and 9.

Figure 1E:
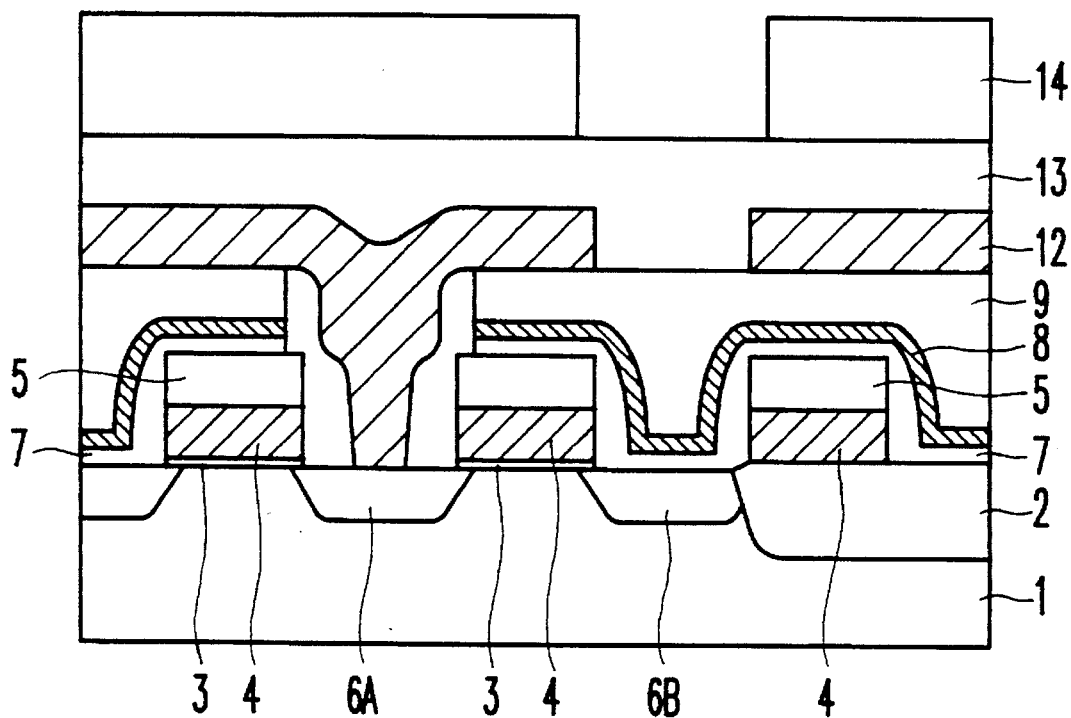

Referring to FIG. 1E, a bit line 12 is formed by filling the first contact hole with such conductive material as polysilicon, with the bit line 12 forming the entire surface of the third insulating layer 9. A portion of the bit line 12 on the third insulating layer 9 is etched by a lithography method and an etching method so that a portion of the third insulating layer 9 corresponding to the source region 6B is exposed. A fourth insulating layer 13 is formed on the entire surface of the resulting structure including the bit line 12 and an exposed portion of the third insulating layer 9, thereafter planarizing the fourth insulating layer 13. A second photoresist pattern 14 is formed on the fourth insulating layer 13 so that a portion of the fourth insulating layer 13 corresponding to the source region 6B is exposed. It does not matter that an opening of the second photoresist pattern 14 is extended to the bit line 12 or the gate electrode 4 adjacent to the source region 6B. The fourth insulating layer 13 is formed with BPSG, thereafter planarizing the fourth insulating layer 13 by a flow process.

Figure 1F:
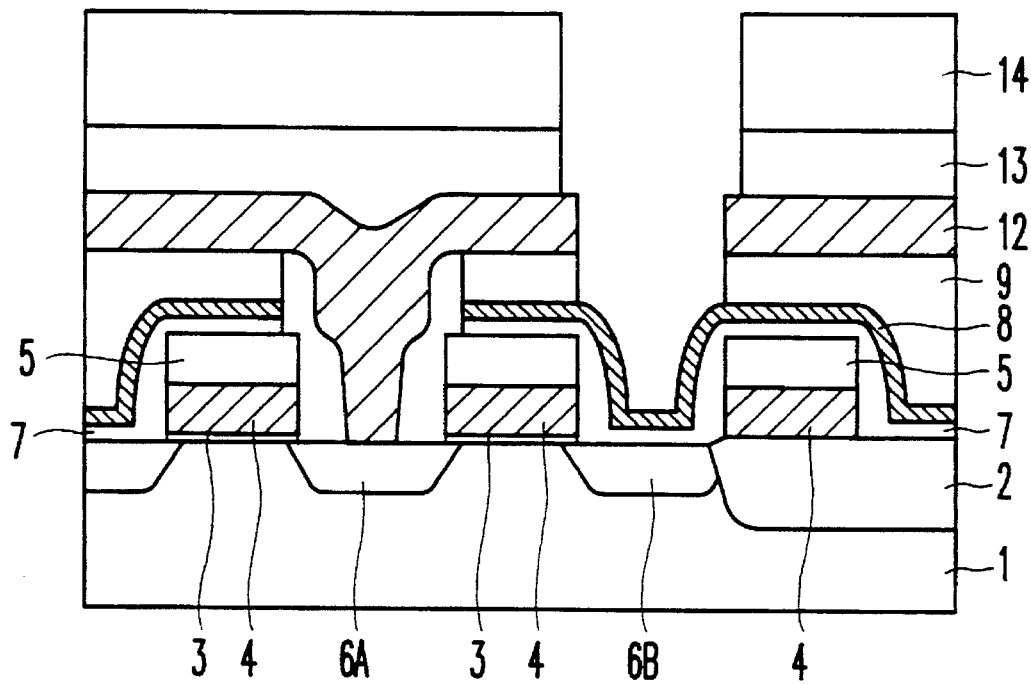

Referring to FIG. 1F, exposed portions of the fourth and third insulating layers 13 and 9 are etched by an anisotropic etching method using the second photoresist pattern 14 as a mask. During this process, the bit line 12 and the conductive layer 8 act as an etching barrier.

In the meantime, it is possible that an exposed portion of the fourth insulating layer 13 is preliminarily etched to expose the bit line 12, thereafter etching an exposed portion of the bit line 12, and the residual fourth insulating layer 13 and exposed portions of the third insulating layer 9 are then lastly etched.

Figure 1G:
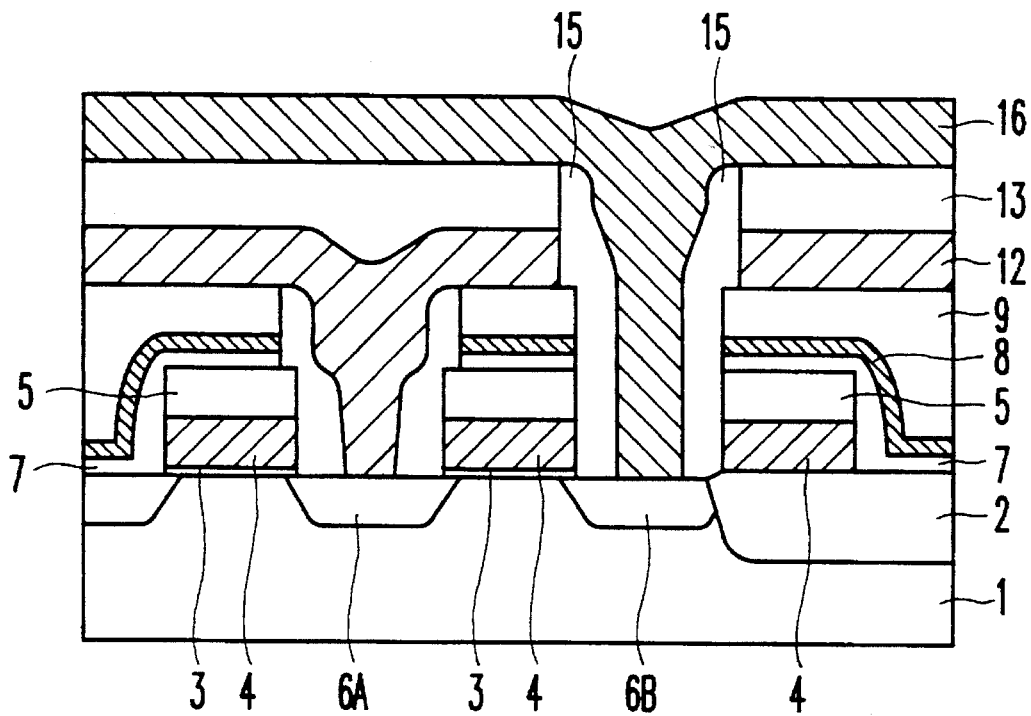

Referring to FIG. 1G, exposed portions of the conductive layer 8 and the bit line 12 are etched by an anisotropic etching method using the second photoresist pattern 14 as a mask, and an exposed portion of the second insulating layer 7 is then etched by an anisotropic etching method to expose the source region 6B, thereby forming a second contact hole for a charge storage electrode. The second photoresist pattern 14 is removed and a second insulating spacer 15 is then formed on the inner walls of the second contact hole. A charge storage electrode 16 is formed by filling the second contact hole with such conductive material as polysilicon. During this process of etching the exposed portion of the conductive layer 8, the second insulating layer 7 acts as an etching barrier. The second insulating spacer 15 to insulate the conductive layer 8, the bit line 12 and the charge storage electrode 16 may be formed by oxidizing an exposed surface of the conductive layer 8 and the exposed bit line 12. The exposed portion of the conductive layer 8 may be etched by an isotropic etching method using. At this time, an etched surface of the conductive layer 8 and the bit line 12 which are formed on the second contact hole are formed inside an etched surface of the second, third and fourth insulating layers 7, 9 and 13.

As described above, a method of manufacturing a semiconductor device according to the present invention can eliminate the capacitor coupling phenomenon between a bit line and a word line by forming a conductive layer between the bit line and the word line into which a desired voltage is applied as well as decrease the contact size by forming a bit line contact with a self alignment method using the conductive layer as an etching barrier and by forming a charge storage electrode contact through a self alignment method sequentially using the bit line and the conductive layer as etching barriers.

Although this invention has been described in its preferred embodiment with a certain degree of particularity, one skilled in the art would know that the preferred embodiment disclosed here is only an example and that the construction, combination and arrangement of its parts may be varied without departing from the spirit and the scope of the invention.

What is claimed is:

1. A method of manufacturing a semiconductor device, comprising the steps of:

forming a plurality of gate electrodes on a silicon substrate on which an isolation layer is formed, thereafter forming a first insulating layer on said gate electrodes, respectively;

forming a drain region and a source region on said substrate using openings between said gate electrodes;

sequentially forming a second insulating layer and conductive layer on said first insulating layer including said drain region and said source region;

forming a third insulating layer on said conductive layer, and forming a first photoresist pattern on said third insulating layer so that a portion of said third insulating layer corresponding to said drain region is exposed;

etching an exposed portion of said third insulating layer;

sequentially etching said conductive layer and said second insulating layer, exposed by etching said third insulating layer, to expose said drain region, thereby forming a first contact hole for a bit line;

removing said first photoresist pattern, and forming a first insulating spacer on the inner walls of said first contact hole;

forming a bit line connected to said drain region by filling said first contact hole with a conductive material, with said bit line forming on said third insulating layer;

etching a portion of said bit line so that a portion of said third insulating layer corresponding to said source region is exposed;

forming a fourth insulating layer on said bit line including an exposed portion of said third insulating layer, and forming a second photoresist pattern on said fourth insulating layer so that a portion of said fourth insulating layer corresponding to said source region is exposed;

sequentially etching said fourth and third insulating layers, exposed by said photoresist pattern;

sequentially etching said conductive layer, said bit line and said second insulating layer, exposed by said fourth and third insulating layers, to expose said source region, thereby forming a second contact hole for a charge storage electrode;

removing said second photoresist pattern, and forming a second insulating spacer on the inner walls of said second contact hole; and forming a bit line connected to said source region by filling said second contact hole.

2. The method of claim 1, wherein said conductive layer is formed with polysilicon.

3. The method of claim 1, wherein said conductive layer is formed with amorphous silicon.

4. The method of claim 1, wherein said third and fourth insulating layers are formed with BPSG, respectively, thereafter planarizing by a flow process.

5. The method of claim 1, wherein an opening of said first photoresist pattern is extended to said gate electrode adjacent to said drain region.

6. The method of claim 1, wherein an opening of said second photoresist pattern is extended to said gate electrode adjacent to said source region.

7. The method of claim is wherein said first insulating spacer is formed by oxidizing said conductive layer exposed on the inner walls of the first contact hole.

8. The method of claim 1, wherein said second insulating spacer is formed by oxidizing said conductive layer and said bit line exposed on the inner walls of the second contact hole.

9. The method of claim is wherein said third insulating layer exposed by said first photoresist pattern is etched by an anisotropic etching method.

10. The method of claim 1 or 9, wherein said conductive layer acts as an etching barrier during said third insulating layer exposed by said first photoresist pattern is etched.

11. The method of claim 1, wherein said fourth and third insulating layers exposed by said second photoresist pattern are etched by an anisotropic etching method.

12. The method of claim 1 or 11, wherein said bit line and said conductive layer act as an etching barrier while said fourth and third insulating layers exposed by said second photoresist pattern are etched.

13. The method of claim 1, wherein said second insulating layer acts as an etching barrier while said conductive layer, exposed by etching said third insulating layer using said first photoresist pattern, is etched.

14. The method of claim 1, wherein said second insulating layer acts as an etching barrier while said conductive layer, exposed by etching said fourth and third insulating layers using said second photoresist pattern, is etched.

15. A method of manufacturing a semiconductor device, comprising the steps of:

forming a plurality of gate electrodes on a silicon substrate on which an isolation layer is formed, thereafter forming a first insulating layer on said gate electrodes, respectively;

forming a drain region and a source region on said substrate using openings between said gate electrodes;

sequentially forming a second insulating layer and conductive layer on said first insulating layer including said drain region and said source region;

forming a third insulating layer on said conductive layer, and forming a first photoresist pattern on said third insulating layer so that a portion of said third insulating layer corresponding to said drain region is exposed;

etching an exposed portion of said third insulating layer;

sequentially etching said conductive layer and said second insulating layer, exposed by etching said third insulating layer, to expose said drain region, thereby forming a first contact hole for a bit line;

removing said first photoresist pattern, and forming a first insulating spacer on the inner walls of said first contact hole;

forming a bit line connected to said drain region by filling said first contact hole with a conductive material, with said bit line forming on said third insulating layer;

etching a portion of said bit line so that a portion of said third insulating layer corresponding to said source region is exposed;

forming a fourth insulating layer on said bit line including an exposed portion of said third insulating layer, and forming a second photoresist pattern on said fourth insulating layer so that a portion of said fourth insulating layer corresponding to said source region is exposed;

etching an exposed portion of the fourth insulating layer to expose said bit line, thereafter etching an exposed portion of said bit line;

sequentially etching residual portion of said fourth insulating layer and an exposed portion of said third insulating layer;

sequentially etching said conductive layer, and said second insulating layer, exposed by etching of said fourth and third insulating layers, to expose said source region, thereby forming a second contact hole for a charge storage electrode;

removing said second photoresist pattern, and forming a second insulating spacer on the inner walls of said second contact hole; and forming a bit line connected to said source region by filling said second contact hole.

16. The method of claim 15, wherein said conductive layer is formed with polysilicon.

17. The method of claim 15, wherein said conductive layer is formed with amorphous silicon.

18. The method of claim 15, wherein said third and fourth insulating layers are formed with BPSG, respectively, thereafter planarizing by a flow process.

19. The method of claim 15, wherein an opening of said first photoresist pattern is extended to said gate electrode adjacent to said drain region.

20. The method of claim 15, wherein an opening of said second photoresist pattern is extended to said gate electrode adjacent to said source region.

21. The method of claim 15, wherein said first insulating spacer is formed by oxidizing said conductive layer exposed on the inner walls of the first contact hole.

22. The method of claim 15, wherein said second insulating spacer is formed by oxidizing said conductive layer and said bit line exposed on the inner walls of the second contact hole.

23. The method of claim 15, wherein said third insulating layer exposed by said first photoresist pattern is etched by an anisotropic etching method.

24. The method of claim 15 or 23, wherein said conductive layer acts as an etching barrier while said third insulating layer exposed by said first photoresist pattern is etched.

25. The method of claim 15, wherein said fourth and third insulating layers exposed by said second photoresist pattern, are etched by an anisotropic etching method.

26. The method of claim 15, wherein said second insulating layer acts as an etching barrier while said conductive layer, exposed by etching said third insulating layer using said first photoresist pattern, is etched.

27. The method of claim 15, wherein said second insulating layer acts as an etching barrier while said conductive layer, exposed by etching said fourth and third insulating layers using said second photoresist pattern, is etched.

* * * * *